(12) United States Patent  
Kamata

(10) Patent No.: US 9,111,990 B1  
(45) Date of Patent: Aug. 18, 2015

(54) SEMICONDUCTOR DEVICE

(71) Applicant: Kabushiki Kaisha Toshiba, Minato-ku, Tokyo (JP)

(72) Inventor: Shuji Kamata, Nonoichi Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/471,804

(22) Filed: Aug. 28, 2014

(30) Foreign Application Priority Data

Feb. 27, 2014 (JP) ................................. 2014-037565

(51) Int. Cl.
| H01L 29/66 | (2006.01) |
| H01L 29/739 | (2006.01) |
| H01L 29/417 | (2006.01) |
| H01L 29/04 | (2006.01) |
| H01L 29/51 | (2006.01) |
| H01L 29/16 | (2006.01) |
| H01L 29/08 | (2006.01) |

(52) U.S. Cl.
CPC ............ *H01L 29/7397* (2013.01); *H01L 29/04* (2013.01); *H01L 29/0804* (2013.01); *H01L 29/0821* (2013.01); *H01L 29/16* (2013.01); *H01L 29/41708* (2013.01); *H01L 29/51* (2013.01)

(58) Field of Classification Search
CPC ................ H01L 29/4236; H01L 29/7813
See application file for complete search history.

(56) References Cited

U.S. PATENT DOCUMENTS

2005/0156201 A1* 7/2005 Matsuda ..................... 257/213  
2005/0263852 A1* 12/2005 Ogura et al. ................ 257/565

FOREIGN PATENT DOCUMENTS

| JP | 2007-019558 A | 1/2007 |
| JP | 2009-043782 A | 2/2009 |
| JP | 2010-093080 A | 4/2010 |
| JP | 2011-082585 A | 4/2011 |

* cited by examiner

*Primary Examiner* — Daniel Whalen  
(74) *Attorney, Agent, or Firm* — White & Case LLP

(57) ABSTRACT

A semiconductor device according to embodiments includes a semiconductor substrate, first semiconductor layers of a first conductive type provided on a surface of the semiconductor substrate, extend in a first direction, and are surrounded by a gate layer, second semiconductor layers of the first conductive type provided between the first semiconductor layers, a third semiconductor layer of the first conductive type provided at ends of the first direction of the first semiconductor layers and is surrounded by the gate layer, a fourth semiconductor layer of a second conductive type provided in the semiconductor substrate, a sixth semiconductor layer of the first conductive type provided on a back surface of the semiconductor substrate, a seventh semiconductor layer of the second conductive type provided between the sixth semiconductor layer and the first semiconductor layers, an emitter electrode, and a collector electrode.

16 Claims, 6 Drawing Sheets

SEMICONDUCTOR DEVICE

CROSS-REFERENCE TO RELATED APPLICATION

This application is based upon and claims the benefit of priority from Japanese Patent Application No. 2014-037565, filed on Feb. 27, 2014, the entire contents of which are incorporated herein by reference.

FIELD

Embodiments described herein relate generally to a semiconductor device.

BACKGROUND

As an example of a power semiconductor device, an insulated gate bipolar transistor (IGBT) has been known. In the IGBT, a method of suppressing discharging of holes from an n-type drift layer has been used to decrease on-resistance between a collector electrode and an emitter electrode. In this method, the holes discharged from the n-type drift layer to the emitter electrode are suppressed, so that an injection amount of electrons is relatively increased, thereby decreasing the on-resistance of the IGBT. For example, a structure in which p-type layers (dummy regions) interposed by trench gate electrodes between p-type base layers and electrically insulated from each other are provided, so-called a trench injection enhanced gate transistor (IEGT) has been suggested.

In the trench IEGT, excessive holes accumulated in the dummy region are discharged at the time of turning-off. However, efficient hole discharge may be disabled in an end of an device region (or an active region). In this case, a current may be concentrated at the end of the device region, the enormous current may flow, and a device may be braked down.

DETAILED DESCRIPTION

Figure 1A:
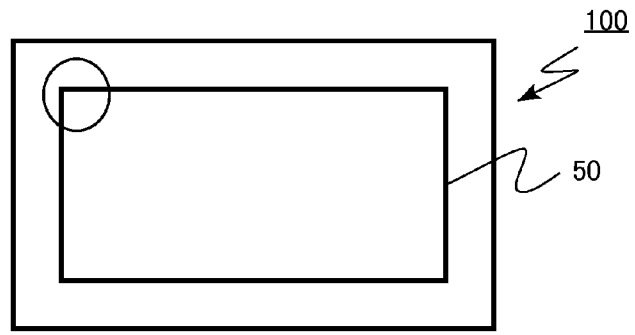
FIGS. 1A and 1B are schematic plan views of a semiconductor device according to a first embodiment.

A semiconductor device according to embodiments includes a semiconductor substrate having a first surface and a second surface facing the first surface; a plurality of first semiconductor layers of a first conductive type provided in the semiconductor substrate of the second surface side, the first semiconductor layers extending in a first direction, the first semiconductor layers arranged in a second direction orthogonal to the first direction, each of the first semiconductor layers surrounded by a gate layer, a gate insulating film interposed between each of the first semiconductor layers and the gate layer; a plurality of second semiconductor layers of the first conductive type provided between the first semiconductor layers adjacent to each other in the second direction, the second semiconductor layers having a depth smaller than a depth of the first semiconductor layers in a direction toward the first surface from the second surface; a plurality of third semiconductor layers of the first conductive type provided in the semiconductor substrate of the second surface side, each of the third semiconductor layers arranged at ends of the first direction of each of the first semiconductor layers, each of the third semiconductor layers surrounded by the gate layer, the gate insulating film interposed between each of the third semiconductor layers and the gate layer, a depth of the third semiconductor layers being substantially equal to the depth of the first semiconductor layers in the direction toward the first surface from the second surface; a fourth semiconductor layer of a second conductive type provided in the semiconductor substrate at the second surface side of the second semiconductor layers; a sixth semiconductor layer of the first conductive type provided in the semiconductor substrate at the first surface side of the first semiconductor layers; a seventh semiconductor layer of the second conductive type provided between the first, second, and third semiconductor layers and the sixth semiconductor layer; an emitter electrode electrically connected to the third and fourth semiconductor layers; and a collector electrode electrically connected to the sixth semiconductor layer.

The following is a description of embodiments with reference to the accompanying drawings. In the following description, like components are denoted by like reference numerals and explanation of components described once will not be repeated. In the following embodiments, an example of the case in which a first conductive type is a p type and a second conductive type is an n type will be described.

In addition, in the present specification, the notations of an $n^+$ type, an n type, and an $n^-$ type mean that n-type impurity concentrations become low in order of the $n^+$ type, the n type, and the $n^-$ type. Likewise, the notations of a $p^+$ type, a p type, and a $p^-$ type mean that p-type impurity concentrations become low in order of the $p^+$ type, the p type, and the $p^-$ type.

The n-type impurities are, for example, phosphorous (P) or arsenic (As). In addition, the p-type impurities are, for example, boron (B).

First Embodiment

A semiconductor device according to this embodiment includes a semiconductor substrate that has a first surface and a second surface facing the first surface, a plurality of first semiconductor layers of a first conductive type that are provided in the semiconductor substrate of the second surface side, extend in a first direction, are arranged in a second direction orthogonal to the first direction, and are surrounded by a gate layer with a gate insulating film therebetween, a plurality of second semiconductor layers of the first conductive type that are positioned between the first semiconductor layers adjacent to each other in the second direction and have a depth smaller than a depth of the first semiconductor layers in a direction toward the first surface from the second surface, a third semiconductor layer of the first conductive type that is provided in the semiconductor substrate of the second surface side, is arranged in ends of the first direction of the first semiconductor layers, is surrounded by the gate layer with the gate insulating film therebetween, and has a depth equal to the depth of the first semiconductor layers in the direction toward the first surface from the second surface, a fourth semiconductor layer of a second conductive type that is provided at the second surface side of the second semiconductor layers, a sixth semiconductor layer of the first conductive type that is provided on the first surface, a seventh semiconductor layer of the second conductive type that is provided between the first, second, and third semiconductor layers and the sixth semiconductor layer, an emitter electrode that is electrically connected to the third and fourth semiconductor layers, and a collector electrode that is electrically connected to the sixth semiconductor layer.

Figure 1B:
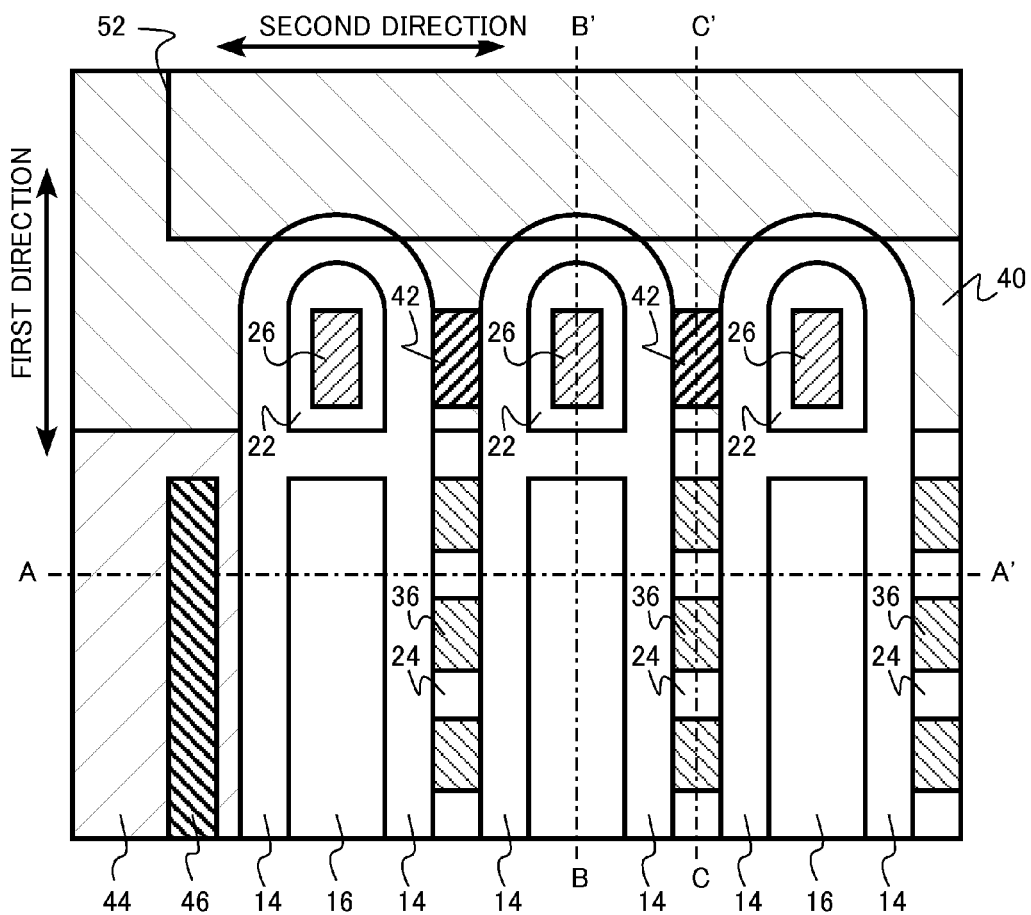

FIGS. 1A and 1B are schematic plan views of the semiconductor device according to this embodiment. FIG. 1A is an entire view of the semiconductor device. FIG. 1B is an enlarged view of a device region end shown by a circle in FIG. 1A.

Figure 2:
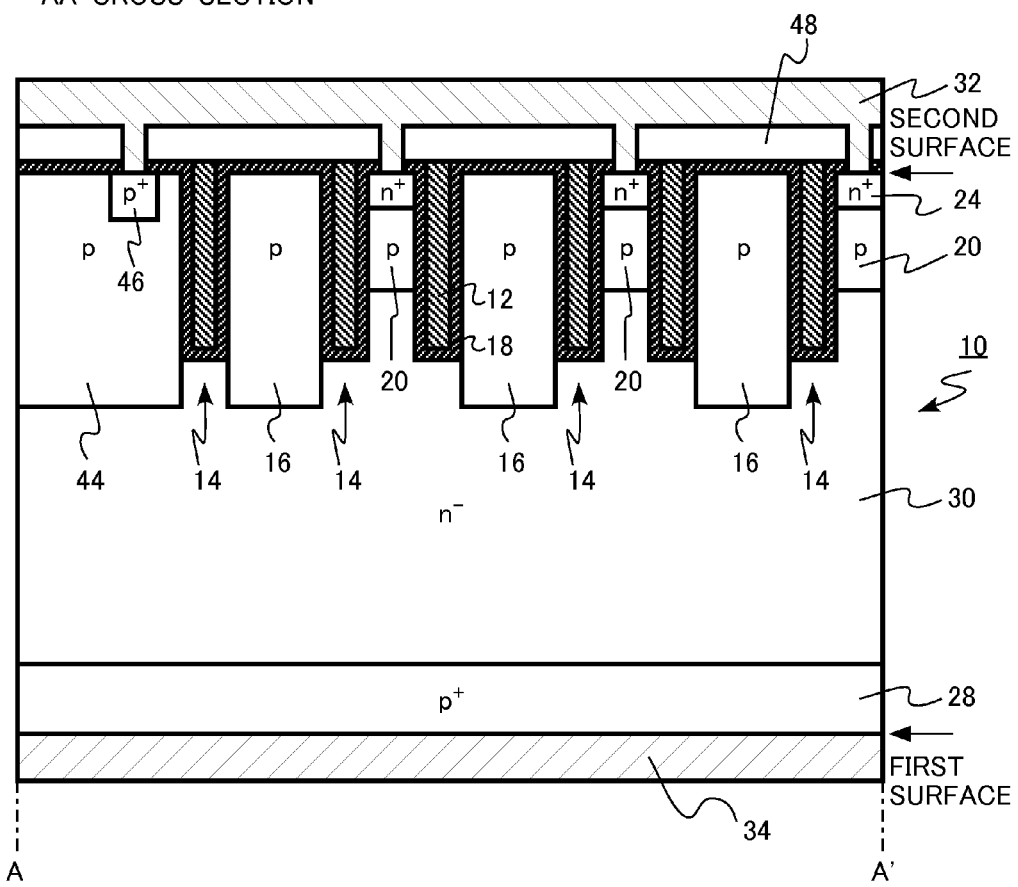
FIG. 2 is a schematic cross-sectional view taken along the line A-A' of FIG. 1B.
Figure 3:
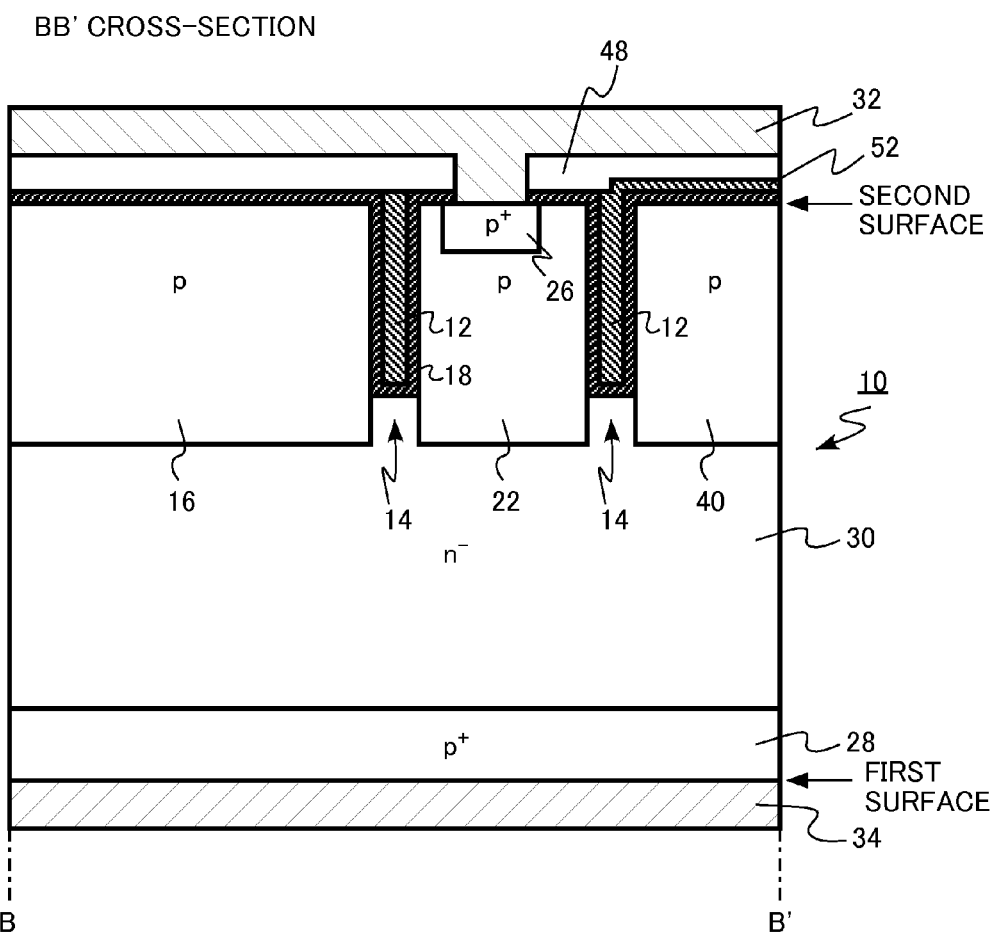
FIG. 3 is a schematic cross-sectional view taken along the line B-B' of FIG. 1B.
Figure 4:
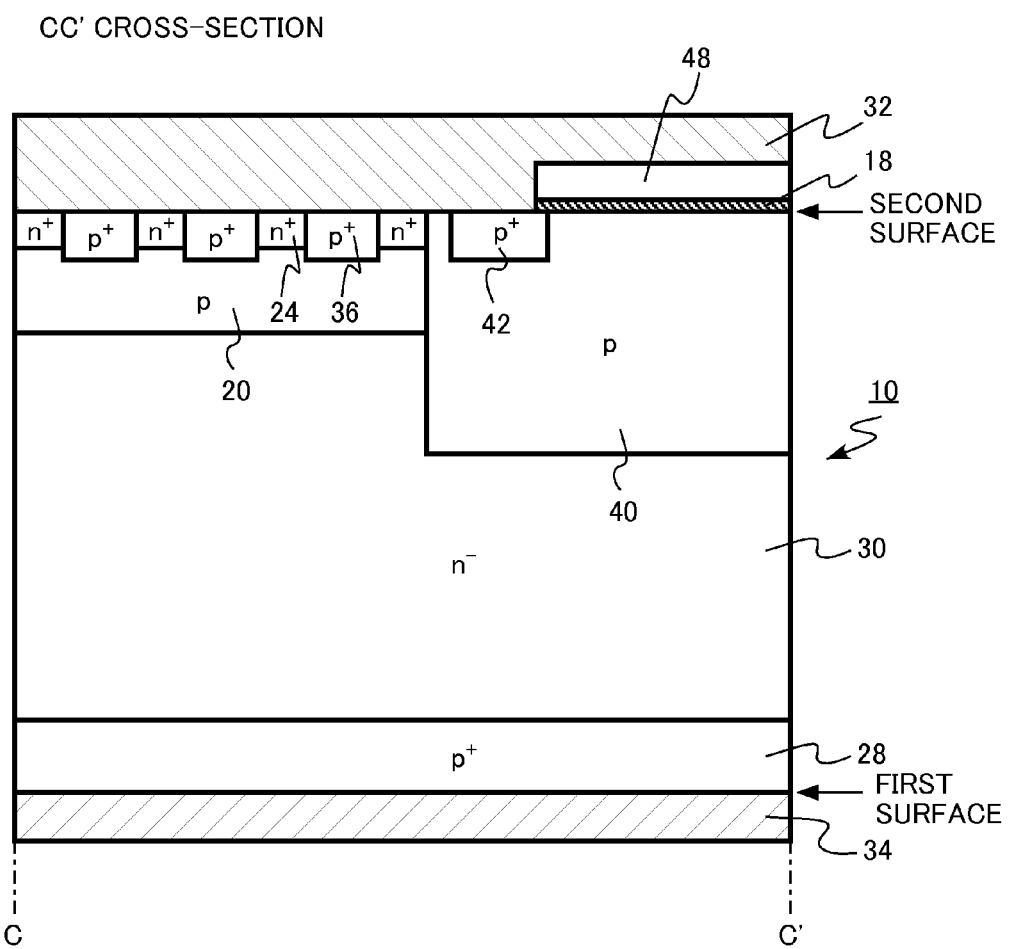
FIG. 4 is a schematic cross-sectional view taken along the line C-C' of FIG. 1B.

FIG. 2 is a schematic cross-sectional view taken along the line A-A' of FIG. 1B. FIG. 3 is a schematic cross-sectional view taken along the line B-B' of FIG. 1B. FIG. 4 is a schematic cross-sectional view taken along the line C-C' of FIG. 1B.

The semiconductor device according to this embodiment is a trench IEGT in which an emitter electrode and a collector electrode are provided with a semiconductor substrate therebetween and a dummy region to suppress carrier discharge at the time of turning-on is provided.

In an IEGT 100 according to this embodiment, a device region 50 is provided in a center portion, as illustrated in FIG. 1A. Around the device region 50, a termination structure such as a guard ring to prevent a breakdown voltage from decreasing at an end of the device region 50 is formed.

The semiconductor device (IEGT) according to this embodiment includes a semiconductor substrate 10 that has a first surface and a second surface facing the first surface, as illustrated in FIG. 2. The semiconductor substrate 10 is, for example, single-crystalline silicon.

As illustrated in FIG. 2, a plurality of p-type dummy regions (first semiconductor layers) 16 surrounded by a trench 14 having a gate layer 12 provided therein and electrically insulated are provided at the second surface side of the semiconductor substrate 10. The gate layer 12 is provided to interpose a gate insulating film 18 with the dummy region 16. The dummy region 16 has a function of suppressing holes from being discharged when the IEGT 100 is turned on and promoting electron injection effectively.

The depth of the dummy region 16 is preferably equal to or more than the depth of the trench 14. By setting the depth of the dummy region 16 to be equal to or more than the depth of the trench 14, a potential of the dummy region can be suppressed from being increased by the holes accumulated in the dummy region 16 when the IEGT 100 is turned on and a negative capacity can be suppressed from being generated.

The gate layer 12 is, for example, polycrystalline silicon in which n-type impurities are doped. In addition, the gate insulating film 18 is, for example, a thermal oxide film of silicon.

As illustrated in FIG. 1B, the dummy region 16 extends in a first direction and is arranged in a second direction orthogonal to the first direction. In addition, the dummy region 16 is surrounded by the trench 14. The dummy region 16 is in an electrically insulated state, that is, a floating state.

In addition, as illustrated in FIG. 2, p-type base regions (second semiconductor layers) 20 each of which is interposed by the dummy region 16 and the trench 14 are provided at the second surface side of the semiconductor substrate 10. A depth of the base region 20 is smaller than depths of the dummy region 16 and the trench 14. The base region 20 functions as a channel flowing electrons, when the IEGT 100 is turned on.

In addition, as illustrated in FIGS. 1B and 3, a carrier discharge region (third semiconductor layer) 22 is provided in an end of the first direction of the dummy region 16 at the second surface side of the semiconductor substrate 10. The carrier discharge region 22 is surrounded by the trench 14 having the gate layer 12 provided therein.

The carrier discharge region 22 has the same depth as that of the dummy region 16. Here, the same depth is the concept including the case in which the depths are completely matched with each other and the case in which an error is generated by a variation of a manufacturing process even though it is demanded to realize the same depths.

An end of the first direction of the trench 14 surrounding the carrier discharge region 22 has a curved shape, as illustrated in FIG. 1B.

As illustrated in FIGS. 1B and 3, the gate layer 12 is extracted from the end of the first direction of the trench 14 surrounding the carrier discharge region 22 to the surface of the semiconductor substrate 10, by a gate extraction layer 52. The gate extraction layer 52 is connected to a gate electrode not illustrated in the drawings.

The IEGT 100 includes an $n^+$-type emitter layer (fourth semiconductor layer) 24 provided at the second surface side of the base region 20, as illustrated in FIG. 2. The emitter layer 24 has a function of injecting electrons, when the IEGT is turned on. As illustrated in FIG. 4, a $p^+$-type base contact layer 36 is provided to be adjacent to the $n^+$-type emitter layer 24, at the second surface side of the base region 20. That is, the $n^+$-type emitter layer 24 and the $p^+$-type base contact layer 36 are alternately provided in the first direction.

In addition, the IEGT 100 includes a $p^+$-type connection region (fifth semiconductor layer) 26 provided at the second surface side of the carrier discharge region 22, as illustrated in FIGS. 1B and 3. The $p^+$-type connection region 26 has a p-type impurity concentration higher than that of the carrier discharge region 22. The $p^+$-type connection region 26 has a function of promoting hole discharge, when the IEGT is turned off.

The IEGT 100 includes a $p^+$-type collector layer (sixth semiconductor layer) 28 provided at the first surface side of the semiconductor substrate 10, as illustrated in FIGS. 2 to 4. In addition, an $n^-$-type drift layer (seventh semiconductor layer) 30 is provided between the collector layer 28 and the dummy region 16, the base region 20, and the carrier discharge region 22.

The IEGT 100 includes an emitter electrode 32 that is electrically connected to the emitter layer 24, the base region 20, the base contact layer 36, and the connection region 26, as illustrated in FIGS. 2 to 4. The IEGT 100 further includes a collector electrode 34 that is electrically connected to the collector layer 28. For example, each of the emitter electrode 32 and the collector electrode 34 is made of a metal.

An interlayer insulating film 48 is provided between the emitter electrode 32 and the dummy region 16. The interlayer insulating film 48 is, for example, a silicon oxide film.

As illustrated in FIGS. 1A, 1B, and 3, a p-type first peripheral region (eighth semiconductor layer) 40 is provided in the first direction end of the device region 50 of the second surface side of the semiconductor substrate 10. The first peripheral region 40 has the same depth as that of the dummy region 16.

As illustrated in FIGS. 1B and 4, a $p^+$-type connection region (ninth semiconductor layer) 42 is provided in the first peripheral region 40. A $p^+$-type connection region 42 is provided in a partial region between the trenches 14 adjacent to each other. A p-type impurity concentration of the $p^+$-type connection region 42 is higher than a p-type impurity concentration of the first peripheral region 40. The $p^+$-type connection region 42 has a function of promoting hole discharge, when the IEGT is turned off.

As illustrated in FIGS. 1B and 2, a p-type second peripheral region (tenth semiconductor layer) 44 is provided in the second direction end of the device region 50 of the second surface side of the semiconductor substrate 10. The second peripheral region 44 has the same depth as that of the dummy region 16.

In the second peripheral region 44, a p'-type connection region (eleventh semiconductor layer) 46 that extends in the first direction and is adjacent to the trench 14 is provided. A p-type impurity concentration of the $p^+$-type connection region 46 is higher than a p-type impurity concentration of the second peripheral region 44. The $p^+$-type connection region 46 has a function of promoting hole discharge, when the IEGT is turned off.

The first peripheral region 40 of the p type and the second peripheral region 44 of the p type may be a continuous $p^+$-type impurity layer and may be a partially provided $p^+$-type impurity layer.

Next, a function and an effect of this embodiment will be described. When the IEGT 100 is turned on, a channel (inversion layer) is formed on a side of the trench 14 of the base region 20 as the potential of the gate layer 12 increases. By the formation of the channel, electrons flow from the emitter layer 24 to the collector layer 28 and holes flow from the collector layer 28 to the emitter layer 24.

At this time, the dummy region 16 is provided to suppress apart of the holes from being discharged from the emitter layer 24. The dummy region 16 is provided, so that injection of the electrons is effectively promoted and on-current of the IEGT 100 increases.

In addition, when the IEGT 100 is turned off, the excessive holes accumulated by the dummy region 16 are discharged to the emitter electrode 32 through the base contact layer 36 adjacent to the dummy region 16 with the trench 14 therebetween. Because it is adjacent to the first peripheral region 40 in the end of the device region 50, a ratio of an occupying area of the dummy region 16 to the base contact layer 36 increases. For this reason, the excessive carriers are not discharged to the emitter electrode 32 when the IEGT is turned off and the current is concentrated on the end of the device region 50. As a result, the element may be destroyed.

In this embodiment, the carrier discharge region 22 that is connected to the emitter electrode 32 through the $p^+$-type connection region 26 is provided at the end of the first direction of the dummy region 16. By providing the carrier discharge region 22, the excessive holes can be discharged from the carrier discharge region 22, when the IEGT 100 is turned off. Therefore, the current is suppressed from being concentrated on the end of the device region 50 and breakdown resistance of the IEGT 100 is improved.

In addition, in this embodiment, the $p^+$-type connection region 42 connected to the emitter electrode 32 is provided in the first peripheral p-type region 40 of the end of the first direction of the dummy region 16. The $p^+$-type connection region 42 is provided in the first peripheral p-type region 40, so that the excessive holes can be discharged, when the IEGT 100 is turned off. Therefore, the current is suppressed from being concentrated on the end of the device region 50 and breakdown resistance of the IEGT 100 is improved.

In addition, in this embodiment, the $p^+$-type connection region 46 connected to the emitter electrode 32 is provided in the second peripheral region 44 of the end of the second direction of the dummy region 16. The $p^+$-type connection region 46 is provided in the second peripheral p-type region 44, so that the excessive holes can be discharged, when the IEGT 100 is turned off. Therefore, the current is suppressed from being concentrated on the end of the device region 50 and breakdown resistance of the IEGT 100 is further improved.

In addition, in this embodiment, the end of the first direction of the trench 14 surrounding the carrier discharge region 22 has a curved shape, as illustrated in FIG. 1B. As such, the end of the trench 14 is formed in the curved shape and a corner is not prepared in the trench, so that an electric field is suppressed from being locally concentrated on the gate insulating film 18. Therefore, the IEGT 100 in which the gate insulating film 18 is suppressed from being destroyed and reliability is high is realized.

According to this embodiment, the IEGT in which the discharge of the excessive carriers in the device region end is promoted and the breakdown resistance is improved can be provided. In addition, the IEGT in which the resistance of the gate insulating film is improved and reliability is improved can be provided.

Second Embodiment

A semiconductor device according to this embodiment includes a semiconductor substrate that has a first surface and a second surface facing the first surface, a plurality of first semiconductor layers of a first conductive type that are provided in the semiconductor substrate of the second surface side, extend in a first direction, are arranged in a second direction orthogonal to the first direction, and are surrounded by a gate layer with a gate insulating film therebetween, a plurality of second semiconductor layers of the first conductive type that are positioned between the first semiconductor layers adjacent to each other in the second direction and have a depth smaller than a depth of the first semiconductor layers in a direction toward the first surface from the second surface, a third semiconductor layer of the first conductive type that is provided in the semiconductor substrate in the second surface, is arranged in ends of the first direction of the first semiconductor layers, are provided between the first semiconductor layers with the gate layer therebetween, and has a depth equal to the depth of the first semiconductor layers in the direction toward the first surface from the second surface, an extracting gate layer that extends from an end of the first direction of the gate layer to an inner portion of the third semiconductor layer in the first direction, a fourth semiconductor layer of a second conductive type that is provided at the second surface side of the second semiconductor layers, a sixth semiconductor layer of the first conductive type that is provided on the first surface, a seventh semiconductor layer of the second conductive type that is provided between the first, second, and third semiconductor layers and the sixth semiconductor layer, an emitter electrode that is electrically connected to the third and fourth semiconductor layers, and a collector electrode that is electrically connected to the sixth semiconductor layer.

Figure 5A:
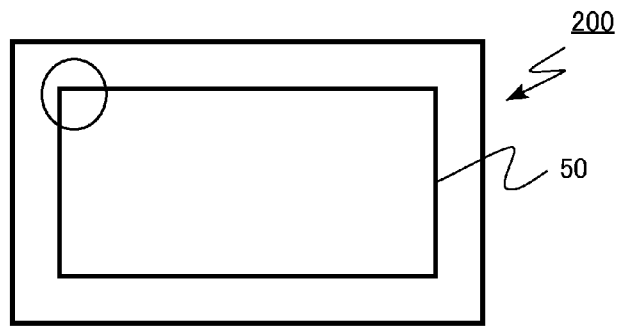
FIGS. 5A and 5B are schematic plan views of a semiconductor device according to a second embodiment.
Figure 5B:
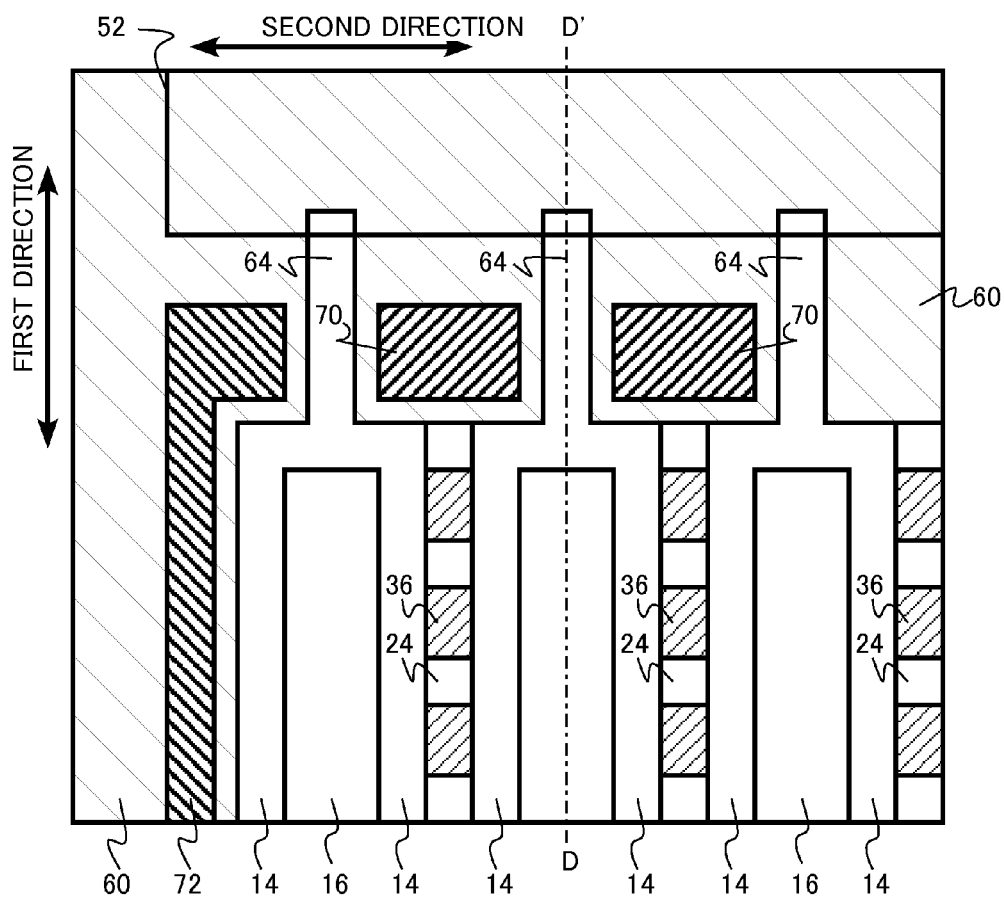

FIGS. 5A and 5B are schematic plan views of the semiconductor device according to this embodiment. FIG. 5A is an entire view of the semiconductor device. FIG. 5B is an enlarged view of a device region end shown by a circle in FIG. 5A.

Figure 6:
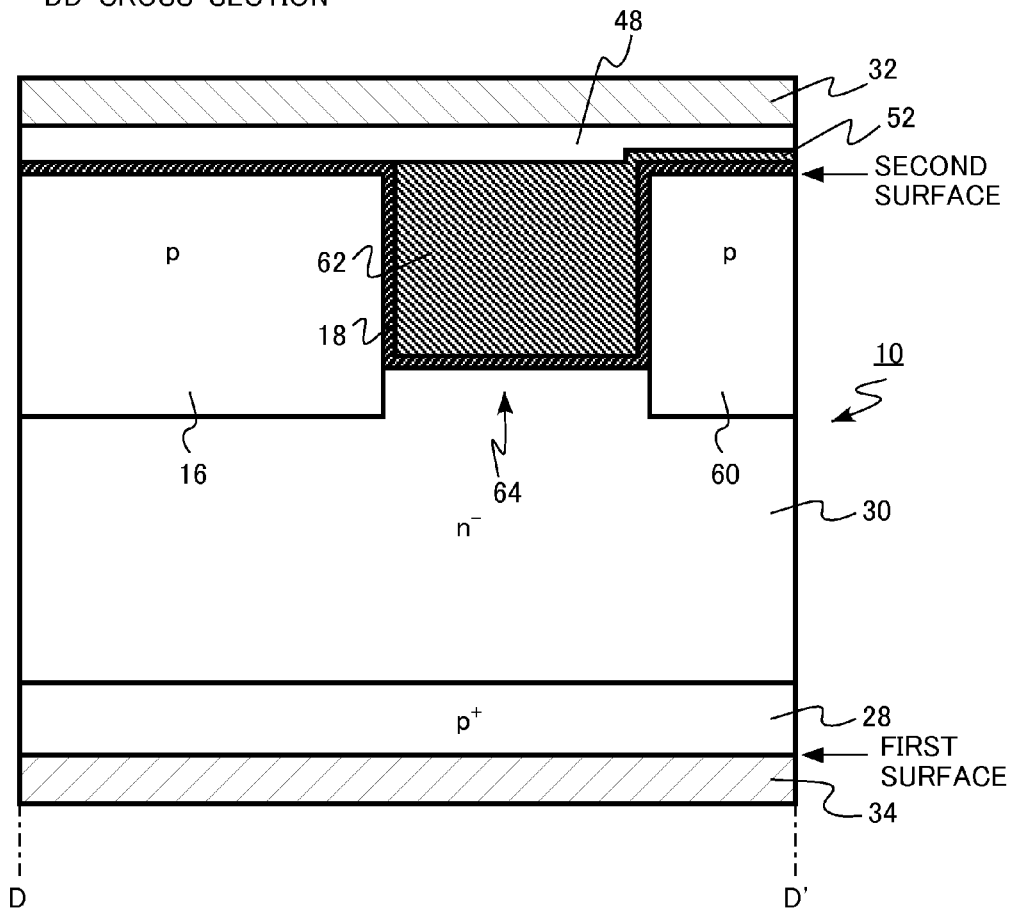
FIG. 6 is a schematic cross-sectional view taken along the line D-D' of FIG. 5B.

FIG. 6 is a schematic cross-sectional view taken along the line D-D' of FIG. 5B. An internal configuration of a device region 50 of an IEGT is the same as that of the first embodiment. Therefore, the internal configuration of the device region 50 of the IEGT will be described with reference to FIG. 2 corresponding to the first embodiment.

The semiconductor device according to this embodiment is a trench IEGT in which an emitter electrode and a collector electrode are provided with a semiconductor substrate therebetween and a dummy region to suppress carrier discharge at the time of turning-on is provided, similar to the first embodiment.

In an IEGT 200 according to this embodiment, a device region 50 is provided in a center portion, as illustrated in FIG. 5A. Around the device region 50, a termination structure such as a guard ring to prevent a breakdown voltage from decreasing at an end of the device region 50 is formed.

The IEGT according to this embodiment includes a semiconductor substrate 10 that has a first surface and a second surface facing the first surface, as illustrated in FIG. 6. The semiconductor substrate 10 is, for example, single-crystalline silicon.

As illustrated in FIG. 2, a plurality of p-type dummy regions (first semiconductor layers) 16 that are surrounded by a trench 14 having a gate layer 12 provided therein and are electrically insulated from each other are provided at the second surface side of the semiconductor substrate 10. The gate layer 12 is provided to interpose a gate insulating film 18 with the dummy region 16. The dummy region 16 has a function of suppressing holes from being discharged when the IEGT 200 is turned on and promoting electron injection effectively.

The depth of the dummy region 16 is preferably equal to or more than the depth of the trench 14. By setting the depth of the dummy region 16 to be equal to or more than the depth of the trench 14, a gate voltage can be suppressed from being oscillated due to generation of a negative capacity between the holes of which discharge is suppressed by the dummy region 16 when the IEGT 200 is turned on and the gate layer 12.

The gate layer 12 is, for example, polycrystalline silicon in which n-type impurities are doped. In addition, the gate insulating film 18 is, for example, a thermal oxide film of silicon.

As illustrated in FIG. 5B, the dummy region 16 extends in the first direction and is arranged in the second direction orthogonal to the first direction. In addition, the dummy region 16 is surrounded by the trench 14. The dummy region 16 is in an electrically insulated state, that is, a floating state.

In addition, as illustrated in FIG. 2, p-type base regions (second semiconductor layers) 20 each of which is interposed by the dummy region 16 and the trench 14 are provided at the second surface side of the semiconductor substrate 10. A depth of the base region 20 is smaller than depths of the dummy region 16 and the trench 14. The base region 20 functions as a channel flowing electrons, when the IEGT 200 is turned on.

In addition, as illustrated in FIGS. 5B and 6, a carrier discharge region (third semiconductor layer) 60 is provided in an end of the first direction of the dummy region 16. The trench 14 having the gate layer 12 is provided between the dummy region 16 and the carrier discharge region 60.

The carrier discharge region 60 has the same depth as that of the dummy region 16. Here, the same depth is the concept including the case in which the depths are completely matched with each other and the case in which an error is generated by a variation of a manufacturing process even though it is demanded to realize the same depths.

The carrier discharge region 60 is also arranged in the end of the second direction of the dummy region 16, as illustrated in FIG. 5B. That is, the carrier discharge region 60 is provided to surround the device region 50.

A gate extracting trench 64 that extends from the end of the first direction of the trench 14 surrounding the dummy region 16 and having the gate layer 12 provided therein to the inner portion of the carrier discharge region 60 in the first direction and has the gate layer 12 provided therein is provided. As illustrated in FIG. 6, the gate layer 12 is extracted from the end of the first direction of the gate extracting trench 64 to the surface of the semiconductor substrate 10, by a gate extraction layer 52. The gate extraction layer 52 is connected to a gate electrode not illustrated in the drawings.

The IEGT 200 includes an $n^+$-type emitter layer (fourth semiconductor layer) 24 provided at the second surface side of the base region 20, as illustrated in FIG. 2. The emitter layer 24 has a function of injecting electrons, when the IEGT 200 is turned on. In addition, a $p^+$-type base contact layer 36 is provided to be adjacent to the $n^+$-type emitter layer 24, at the second surface side of the base region 20.

In addition, the IEGT 200 includes a $p^+$-type first connection region (fifth semiconductor layer) 70 provided at the second surface side of the carrier discharge region 60, as illustrated in FIG. 5B. The first connection region (fifth semiconductor layer) 70 is provided at the first end side of the device region 50. The first connection region 70 has a function of discharging holes, when the IEGT is turned off.

In addition, the IEGT 200 includes a $p^+$-type second connection region 72 provided at the second surface side of the carrier discharge region 60, as illustrated in FIG. 5B. The $p^+$-type second connection region 72 is provided at the second end side of the device region 50. A p-type impurity concentration of the $p^+$-type second connection region 72 is higher than a p-type impurity concentration of the carrier discharge region 60. The $p^+$-type second connection region 72 has a function of discharging holes, when the IEGT 200 is turned off.

The IEGT 200 includes a $p^+$-type collector layer (sixth semiconductor layer) 28 provided at the first surface side of the semiconductor substrate 10, as illustrated in FIGS. 2 and 6. In addition, an $n^-$-type drift layer (seventh semiconductor layer) 30 is provided between the collector layer 28 and the dummy region 16, the base region 20, and the carrier discharge region 60.

The IEGT 200 includes an emitter electrode 32 that is electrically connected to the emitter layer 24, the base region 20, the base contact layer 36, and the connection region 26, as illustrated in FIG. 2. In addition, the IEGT 200 includes a collector electrode 34 that is electrically connected to the collector layer 28. For example, each of the emitter electrode 32 and the collector electrode 34 is made of a metal.

An interlayer insulating film 48 is provided between the emitter electrode 32 and the semiconductor substrate 10. The interlayer insulating film 48 is, for example, a silicon oxide film.

Next, a function and an effect of this embodiment will be described. When the IEGT 200 is turned on, a channel is formed on a side of the trench 14 of the base region 20 as the potential of the gate layer 12 increases. The channel is formed, so that electrons flow from the emitter layer 24 to the collector layer 28 and holes flow from the collector layer 28 to the emitter layer 24.

At this time, the dummy region 16 is provided to suppress apart of the holes from being discharged from the emitter layer 24. The dummy region 16 is provided, so that injection of the electrons is effectively promoted and on-current of the IEGT 200 increases.

In addition, when the IEGT 200 is turned off, the excessive holes accumulated by the dummy region 16 are discharged to the emitter electrode 32 through the base contact layer 36 adjacent to the dummy region 16 with the trench 14 therebetween. In the end of the device region 50, a ratio of an occupying area of the dummy region 16 to the base contact layer 36 increases. For this reason, the excessive carriers are not discharged to the emitter electrode 32 when the IEGT is turned off and the current is concentrated on the end of the device region 50. As a result, the element may be destroyed.

In this embodiment, the carrier discharge region 60 that is connected to the emitter electrode 32 through the p$^+$-type first connection region 70 is provided in the end of the first direction of the dummy region 16. By providing the carrier discharge region 60, the excessive holes can be discharged from the carrier discharge region 60, when the IEGT 200 is turned off. Therefore, the current is suppressed from being concentrated on the end of the device region 50 and breakdown resistance of the IEGT 200 is improved.

In addition, in this embodiment, the carrier discharge region 60 connected to the emitter electrode 32 through the p$^+$-type second connection region 72 is provided in the end of the second direction of the dummy region 16. By providing the carrier discharge region 60, the excessive holes can be discharged from the carrier discharge region 60, when the IEGT 200 is turned off. Therefore, the current is suppressed from being concentrated on the end of the device region 50 and breakdown resistance of the IEGT 200 is improved.

In addition, in this embodiment, the gate extracting trench 64 that extends from the end of the first direction of the trench 14 surrounding the dummy region 16 and having the gate layer 12 provided therein to the inner portion of the carrier discharge region 60 in the first direction and has the extracting gate layer 62 provided therein is provided. In other words, the extracting gate layer 62 that extends from the end of the first direction of the gate layer 12 to the inner portion of the carrier discharge region 60 in the first direction is provided. As such, the gate layer 12 is extracted from the trench 14 surrounding the dummy region 16 by the gate extracting trench 64, so that an area of the p$^+$-type first connection region 70 can be increased as compared with the first embodiment. Therefore, the discharge of the excessive carriers is promoted, the current is further suppressed from being concentrated on the end of the device region 50, and breakdown resistance of the IEGT 200 is further improved.

According to this embodiment, the IEGT in which the discharge of the excessive carriers in the device region end is promoted and the breakdown resistance is improved can be provided.

In the embodiments, the example of the case in which the first conductive type is the p type and the second conductive type is the n type has been described. However, the first conductive type may be the n type and the second conductive type may be the p type.

In the embodiments, the example of the case in which the single-crystalline silicon is used as the material of the semiconductor substrate and the semiconductor layer has been described. However, other semiconductor materials, for example, silicon carbide and gallium nitride may be used.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
    a semiconductor substrate having a first surface and a second surface facing the first surface;
    a plurality of first semiconductor layers of a first conductive type provided in the semiconductor substrate of the second surface side, the first semiconductor layers extending in a first direction, the first semiconductor layers arranged in a second direction orthogonal to the first direction, each of the first semiconductor layers surrounded by a gate layer, a gate insulating film interposed between each of the first semiconductor layers and the gate layer;
    a plurality of second semiconductor layers of the first conductive type provided between the first semiconductor layers adjacent to each other in the second direction, the second semiconductor layers having a depth smaller than a depth of the first semiconductor layers in a direction toward the first surface from the second surface;
    a plurality of third semiconductor layers of the first conductive type provided in the semiconductor substrate of the second surface side, each of the third semiconductor layers arranged at ends of the first direction of each of the first semiconductor layers, each of the third semiconductor layers surrounded by the gate layer, the gate insulating film interposed between each of the third semiconductor layers and the gate layer, a depth of the third semiconductor layers being substantially equal to the depth of the first semiconductor layers in the direction toward the first surface from the second surface;
    a fourth semiconductor layer of a second conductive type provided in the semiconductor substrate at the second surface side of the second semiconductor layers;
    a sixth semiconductor layer of the first conductive type provided in the semiconductor substrate at the first surface side of the first semiconductor layers;
    a seventh semiconductor layer of the second conductive type provided between the first, second, and third semiconductor layers and the sixth semiconductor layer;
    an emitter electrode electrically connected to the third and fourth semiconductor layers; and
    a collector electrode electrically connected to the sixth semiconductor layer.

2. The semiconductor device according to claim 1, wherein an end of the gate layer in the semiconductor substrate in the first direction has a curved shape.

3. The semiconductor device according to claim 1, further comprising:
    an eighth semiconductor layer of the first conductive type provided in the semiconductor substrate of the second surface side, the eighth semiconductor layer arranged at ends of the second semiconductor layers in the first direction, the eighth semiconductor layer having a depth equal to that of the first semiconductor layers in a direction toward the first surface from the second surface,
    wherein the emitter electrode is electrically connected to the eighth semiconductor layer.

4. The semiconductor device according to claim 1, further comprising:
    a tenth semiconductor layer of the first conductive type provided in the semiconductor substrate of the second surface side, the tenth semiconductor layer arranged at the ends of the first semiconductor layers in the second direction with the gate insulating film interposed between the first semiconductor layers and the tenth semiconductor layer, the tenth semiconductor layer extending in the first direction, the tenth semiconductor layer having a depth substantially equal to that of the first semiconductor layers in a direction toward the first surface from the second surface, wherein the emitter electrode is electrically connected to the tenth semiconductor layer.

5. The semiconductor device according to claim 1, further comprising:
a plurality of fifth semiconductor layers provided between the third semiconductor layers and the emitter electrode, the fifth semiconductor layers contacting the emitter electrode, the fifth semiconductor layers having an impurity concentration of the first conductive type higher than that of the third semiconductor layers.

6. The semiconductor device according to claim 3, further comprising:
a ninth semiconductor layer provided between the eighth semiconductor layer and the emitter electrode, the ninth semiconductor layer contacting the emitter electrode, the ninth semiconductor layer having an impurity concentration of the first conductive type higher than that of the eighth semiconductor layer.

7. The semiconductor device according to claim 1, further comprising:
a gate extraction layer connected to an end of the gate layer in the first direction, the gate extraction layer provided above the semiconductor substrate of the second surface side.

8. The semiconductor device according to claim 1, wherein the semiconductor substrate is made of single-crystalline silicon.

9. The semiconductor device according to claim 1, wherein the first conductive type is a p type and the second conductive type is an n type.

10. The semiconductor device according to claim 1, wherein the gate insulating film is a silicon oxide film.

11. A semiconductor device comprising:
a semiconductor substrate having a first surface and a second surface facing the first surface;
a plurality of first semiconductor layers of a first conductive type provided in the semiconductor substrate of the second surface side, the first semiconductor layers extending in a first direction, the first semiconductor layers arranged in a second direction orthogonal to the first direction, each of the first semiconductor layers surrounded by a gate layer, a gate insulating film interposed between each of the first semiconductor layers and the gate layer;
a plurality of second semiconductor layers of the first conductive type provided between the first semiconductor layers adjacent to each other in the second direction, the second semiconductor layers having a depth smaller than a depth of the first semiconductor layers in a direction toward the first surface from the second surface;
a third semiconductor layer of the first conductive type provided in the semiconductor substrate of the second surface side, the third semiconductor layer arranged at ends of the first direction of the first semiconductor layers, the third semiconductor layer provided with the gate layer interposed between the first semiconductor layers and the third semiconductor layer, the third semiconductor layer having a depth substantially equal to the depth of the first semiconductor layers in the direction toward the first surface from the second surface;
an extracting gate layer extending from an end of the first direction of the gate layer to an inner portion of the third semiconductor layer in the first direction;
a fourth semiconductor layer of a second conductive type provided in the semiconductor substrate at the second surface side of the second semiconductor layers;
a sixth semiconductor layer of the first conductive type provided in the semiconductor substrate at the first surface side of the first semiconductor layers;
a seventh semiconductor layer of the second conductive type provided between the first, second, and third semiconductor layers and the sixth semiconductor layer;
an emitter electrode electrically connected to the third and fourth semiconductor layers; and
a collector electrode electrically connected to the sixth semiconductor layer.

12. The semiconductor device according to claim 11, further comprising:
a fifth semiconductor layer provided between the third semiconductor layer and the emitter electrode, the fifth semiconductor layer contacting the emitter electrode, the fifth semiconductor layer having an impurity concentration of the first conductive type higher than that of the third semiconductor layer.

13. The semiconductor device according to claim 11, further comprising:
a gate extraction layer connected to an end of the gate layer in the first direction, the gate extraction layer provided above the semiconductor substrate of the second surface side.

14. The semiconductor device according to claim 11, wherein the semiconductor substrate is made of single-crystalline silicon.

15. The semiconductor device according to claim 11, wherein the first conductive type is a p type and the second conductive type is an n type.

16. The semiconductor device according to claim 11, wherein the gate insulating film is a silicon oxide film.

* * * * *